(12) United States Patent
Hsiung et al.

(10) Patent No.: US 6,759,860 B1
(45) Date of Patent: Jul. 6, 2004

(54) SEMICONDUCTOR DEVICE PACKAGE SUBSTRATE PROBE FIXTURE

(75) Inventors: Steve K. Hsiung, Fremont, CA (US); Kevan V. Tan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 37 days.

(21) Appl. No.: 09/885,687

(22) Filed: Jun. 19, 2001

(51) Int. Cl.[7] .............................................. G01R 31/02
(52) U.S. Cl. ...................................... 324/755; 324/757
(58) Field of Search ................................ 324/755, 757, 324/758, 761, 763, 764, 765, 696, 715, 754, 750, 437, 445, 446, 751; 257/704, 778

(56) References Cited

U.S. PATENT DOCUMENTS

| | | | | |
|---|---|---|---|---|
| 5,534,784 A | * | 7/1996 | Lum | ........................... 324/757 |
| 5,730,634 A | * | 3/1998 | Seko | .............................. 445/3 |
| 5,909,057 A | * | 6/1999 | McCormick | ................. 257/704 |
| 6,051,888 A | * | 4/2000 | Dahl | ........................... 257/778 |

* cited by examiner

Primary Examiner—Kamand Cuneo
Assistant Examiner—Trung Q. Nguyen
(74) Attorney, Agent, or Firm—Conley Rose, PC (57) ABSTRACT

A fixture is used to secure a substrate and to allow movement of a pin relative ot the fixture. The substrate fixture includes a holding table adapted to receive the substrate and a probe pin assembly underneath the table. The substrate is mounted on a table which can move in one-dimension, while the probe pin is moveable relative to the table in another dimension perpendicular to movement of the table. Moving the substrate retaining table and the pin retainer allows for alignment of the probe pin with a backside terminal of a trace conductor of the substrate. The assembly also has vertical height translational mechanism for contacting the probe pin with the backside terminal. Furthermore, the frontside terminal of the trace conductor is accessible to an external probe. A testing device can be connected to the external probe and the probe pin to measure the electrical continuity of the trace conductor.

18 Claims, 6 Drawing Sheets

SEMICONDUCTOR DEVICE PACKAGE SUBSTRATE PROBE FIXTURE

BACKGROUND OF THE INVENTION

1. Field of the Invention

This invention relates to electronic testing and, more particularly, to testing of packaged integrated circuit subsystems.

2. Description of the Related Art

The following descriptions and examples are not admitted to be prior art by virtue of their inclusion within this section.

Until recently, the ongoing quest of the semiconductor industry was to improve the performance of integrated circuits ("ICs") either before or after the integrated circuit was placed in a package and hermetically sealed from the elements. However, advancements in the performance in integrated circuits are now being limited by the technology by which the circuits are packaged. Efficient packaging of integrated circuits involves increasing the package density (i.e., pin-out) and package performance (i.e., electrical conductance and signal speed).

There are several packaging technologies developed to connect integrated circuits to a substrate. For example, the circuit can be coupled using through-hole wire bonding or soldering. Alternatively, the circuit can be bonded using surface mount technology, tape automated bonding, and flip-chip bonding. The drive for more densely configured integrated circuits has lead to an increased pin-out of input/output pads per circuit area. Flip-chip package technologies such as chip scale packaging and direct chip attach have evolved to handle the higher density pad configuring by arranging the pads in an array across the surface topography. The pads can be placed nearing the core logic of the circuit and/or whatever subsystem that involves their use to minimize capacitive coupling and thereby flip chip technology adds to the overall performance of the circuit.

The array of bonding pads are arranged in a two-dimensional array of rows and columns upon a frontside surface of the circuit. Attachment of the array of pads to an underlying board, using the flip chip configuration, involves inverting the circuit so that the frontside surface with the bonding pads faces downward onto a package substrate, which has corresponding set of bonding pads. The circuit and/or board is then heated and a solder connection is formed at the interface between the integrated circuit bonding pads and the bonding pads of the board. When the solder cools and hardens, the I/O pads of the circuit are electrically and mechanically coupled to the bonding pads of the printed circuit board. The printed circuit board, or "board," includes printed conductors extending across the upper, lower or buried surfaces of the board. One or more trace conductors can extend upward from a plane on which multiple trace conductors are formed through vias which contact with the bonding pads. To minimize the mechanical strain on the solder bump attachments due to the coefficient of thermal expansion mismatch between the substrate material of the board and the integrated circuit, an underfill material, which is typically a thermosetting polymer (e.g., an epoxy resin) may be dispensed in liquid form between the IC and the substrate which subsequently hardens and securely encapsulates the solder bumps which form at the interface of the integrated circuit bonding pads and the substrate bonding pads.

A well-suited package substrate for a flip-chip application is a ball grid array ("BGA") substrate. A BGA package substrate may be made of, for example, fiberglass-epoxy printed circuit board material or a ceramic material (e.g., aluminum oxide, alumina, $Al_2O_3$, or aluminum nitride, AlN), and it may be a single layer or a multi-layer fabricated substrate. In a flip-chip design application, the substrate includes two sets of bonding pads: a first set adjacent to the chip and a second set on a surface of the substrate opposite the first set. Accordingly, both sets are arranged in a two-dimensional array across the upper and lower surface of the device package. The substrate may include multiple layers of a patterned conductive material forming electrical conductors. Interlayer vias may be formed by precise drilling for electrical and thermal routing through the substrate. The configuration of interlayer vias and intra-layer patterned electrical conductors results in trace conductors that electrically connect members of the first and second sets of bonding pads. Members of the first set of bonding pads on the upper surface can be solder bump attached to corresponding I/O bonding pads of the inverted integrated circuit, i.e., "flip chip." Members of the second set of bonding pads function as device package terminals, and are coated with solder. The second set of bonding pads of overcoated solder on the underside of the BGA device package allow the substrate (and trace conductors contained therein connected to corresponding I/O bonding pads) to be surface mounted to a larger printed circuit board (e.g., a motherboard). During board assembly, the BGA package is attached to the corresponding bonding pads on the board using standard reflow techniques.

Device failure or performance impairment can occur in these packaged devices if a trace conductor or a group of trace conductors are not properly conducting electrical signals to or from the attached chip. A large electrical resistance measured across a trace conductor may indicate that there is an open or break in the conductive pathway of the trace conductors. There are several ways that this can occur either at the terminal sites or along the length of the trace conductor. The solder balls or solder bumps could have been improperly attached, or experienced critical mechanical strain due to the coefficient of thermal expansion or package mishandling. There could be micro-cracks or other breaks in the terminals or in the trace conductors inside the substrate. There could be manufacturing defects such as, incomplete vias, missing vias, or misaligned vias between the substrate layers. Further, electromigration could cause cracks to form in the solder joints or in the trace conductor line inside the substrate, etc.

To test and locate the exact source of a break in the electrical continuity of a trace conductor requires the destructive dismantling of the package and is typically a final step in failure analysis of such devices. A trace conductor or group of trace conductors will first be pinpointed as a source of an electrical pathway conductivity problem from prior failure analysis tests. A current method for testing the electrical continuity of the trace conductors of the BGA flip-chip package substrates involves first removing the semiconductor chip so as to expose the solder bumps encapsulated in the underfill material beneath the inverted integrated circuit. An electrical testing device such as a multi-meter can then be used to measured the resistance of the trace conductor by connecting the two probe wires of the meter on either end of the trace conductor. Typically, a probe wire is soldered to the trace conductor solder ball terminal on the underneath side of the board. The other probe wire may have a probe needle attached for making electrical contact with the exposed solder bump at the upper surface of the board.

If the resistance measured is defect-level high (a value that is dependent on substrate design), then typically a subsequent upper layer of the substrate is removed by a parallel lapping process, which may be performed by a polishing grinding wheel. Removing the upper layer of the substrate entails removing the solder bumps that lie just beneath the removed integrated circuit. Another resistance probe measurement would be taken. Again if the resistance measured is high, another upper layer can be removed and the measuring procedure repeated on the lower layers until the layer having the defect is found. However, problems can arise using this testing method. The defect may be heat-cured during the solder attachment of the probe wire to the solder ball if the defect is physically located at or in proximity of the solder ball. The subsequent removal of upper substrate layers during the parallel lapping process can put undue tension on the bottom soldered probe wire and thus pull the attached solder ball from the substrate or simply cause the wire or joint to break.

It would be beneficial to provide a mechanism for probing electrical continuity of BGA package substrate trace conductors with a probe that does not requiring heating to form a strong electrical contact between the probe wire and the solder ball terminals. It would be desirable to accomplish such testing using a probe fixture where a probe is attached to the fixture and could be aligned with an underneath solder ball terminal and further adjusted by form superior registry with the terminal. It would be further desirable that the substrate could be easily attached to and unattached from the desirous testing fixture. This would allow for easy manipulation of the substrate for substrate layer removal steps, in which preferably the substrate is first removed away from the probe fixture. In this scenario the probe point solder ball would then not be subjected to any undue external forces during the lapping, or layer removal procedure.

SUMMARY OF THE INVENTION

The problems outlined above may be in large part addressed by a semiconductor package substrate test fixture that includes a moveable holding table adapted to hold a semiconductor package substrate. The substrate can be any single or multi-layered package, and may also be a BGA package designed to receive an inverted integrated circuit, using flip chip connection techniques. The package is readied for testing by removing the overlying, inverted integrated circuit to expose the attachment solder bumps configured within the partially lapped underfill material. The substrate may be a multi-layer substrate, where subsequent upper layers may also be removed, if desired. The substrate is held onto the table with the use of a sliding push plate, where the plate is moveable and can be secured to the table by a thumbscrew secure pin. The plate retains the package on the table by applying mechanical contact and support to an outer portion of the substrate while other opposing portions of the substrate are abutted against retainer walls. The holding table is further adapted so that a backside surface of the substrate is presented to an electrically conductive probe pin. The probe pin extends upward from a probe pin retainer assembly attached to the fixture underneath the table. In an embodiment, the mechanism for alignment of the probe pin with an electrical terminal of a trace conductor on the backside surface of the substrate may be such that the probe pin assembly and the table are arranged onto two separate perpendicular sets of two slide rails. The table is arranged on one set of the two slides rails and is translatable in one independent horizontal direction by the operation of a lead screw coupled to the table. And the assembly is arranged on the other set of two slide rails and is translatable in the other independent horizontal direction by the operation of another lead screw coupled to the assembly. The electrical terminal is preferably a solder ball. An electrical outlet socket on an outer surface of the fixture is electrically connected to the probe pin.

A test device is electrically coupled to the electrical terminal and also to a corresponding electrical terminus of the trace conductor, where the electrical terminus would preferably be either a residual attachment solder bump or the upper end of an exposed trace conductor after subsequent layer removal. The test device is preferably a multi-meter for measuring the electrical continuity of the trace conductor. The probe pin is preferably a pogo pin, which contains a compressible spring for making a strong but non-destructive contact to a single solder ball on the underneath surface of the substrate.

In addition to the test fixture discussed above, a method for testing a package substrate is contemplated herein. The method for testing a semiconductor package may include removing an upper layer of the package, where the first layer removed is at least a portion of the integrated circuit attached to the substrate. An initial test may be conducted before said removing, where the testing includes transmitting an electrical pulse along a trace conductor, measuring a time delay of the reflected pulse, and determining from the delay time a defect location of a defect-level high resistance in the trace conductor as either residing inside or outside the substrate. The package is preferably a flip-chip design BGA package, so that the removing of the entire die will then expose the solder bump flip-chip attachments. The package substrate is then held in place by a sliding push plate on a moveable table on the upper surface of a test fixture. The table is adapted for exposing a backside surface of the substrate to a moveable probe pin attached to a lower part of the fixture. The aligning of the probe pin with an electrical terminal of a trace conductor on the backside surface of the substrate is achieved by moving the package on the table along one independent horizontal direction via a lead screw, where the table is adapted to slide on a pair of parallel rails. The aligning is further accomplished by moving the probe pin, which housed in probe pin assembly, along the other independent horizontal direction via another lead screw to situate the probe pin directly underneath the electrical terminal, where the assembly is adapted to slide on a pair of parallel rails.

Contacting the electrical terminal by the probe pin and the corresponding electrical terminus of the trace conductor on a frontside surface of the substrate by a probe needle is accomplished by first mechanically and electrically contacting the terminal with the probe pin by a thumbscrew vertical height adjusting mechanism, which is coupled to the probe pin for moving the probe pin in the vertical direction. Contacting the terminus with the probe needle may be achieved using a magnifying lens. A test device is connected between the probe pin and the probe needle and may be used for testing the trace conductor electrical properties. The test device is preferably a multi-meter, where the testing measures the electrical resistance of the trace conductor. In an embodiment, if testing measures a defect-level high resistance, then an additional testing step is required, which includes removing an upper layer of the package, holding the substrate on the test fixture, and contacting the probe pin with the electrical terminal and a probe needle with the electrical terminus, connecting the test device between the probe pin and the probe needle, and testing trace conductor electrical properties. It should be noted that aligning may be omitted for this embodiment, since the probe pin should be already substantially aligned with the electrical terminal.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1A:
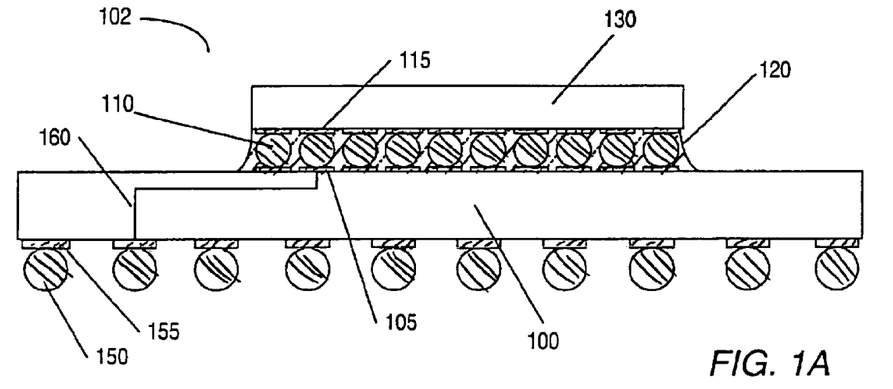
FIG. 1A is a cross-sectional view of a substrate, possibly a ball grid array package, with a flip-chip attached integrated circuit soldered to upward extending bonding pads placed on an upper surface of the substrate.

Turning to the drawings, exemplary embodiments of a method for testing an electronic package are shown. FIG. 1A is partial a cross-sectional view of a package 102. Integrated circuit 130 can be flip-chip mounted to a substrate 100 that bears possibly multiple, co-planar trace conductors, select ones of which are connected to each other on separate layers by a via. Chip 130 is mechanically and electrically attached to substrate 100 by solder bumps 110, where solder bumps 110 attach a two-dimensional array of bonding pads 115 of chip 130 with a corresponding array of bonding pads 105 of the substrate 100. Bonding pads 105 and 115 are of the same physical layout and are in registry with each other which, when bonded by solder bumps 110, form an electrical connection between electronic subcomponents within circuit 130 and corresponding solder balls 150. To lend support and diminish the mechanical strain effect of the coefficient of thermal expansion mismatch between chip 130 and substrate 100, solder bumps 110 are encapsulated in underfill layer 120. Underfill includes any material that is electrically insulative, yet has some thermal conduction capabilities. Substrate 100 is typically a multi-layered structure with trace conductors extending from bonding pads 105 on the upper surface to corresponding bonding pads 155 on the lower surface, oppose the upper surface. The trace conductors carry electrical signals to and from the chip 130. It should be noted that bonding pads 105 and 155 of substrate 100 preferably should have the same total number of pads, but the density of pads 105 is much greater than that for pads 155. For illustrative purposes only, only a few of possibly many more bonding pads on the upper and lower surfaces of substrate 100 are shown. Moreover, only one trace conductor 160 of possibly numerous trace conductors is shown for sake of brevity.

Figure 1B:
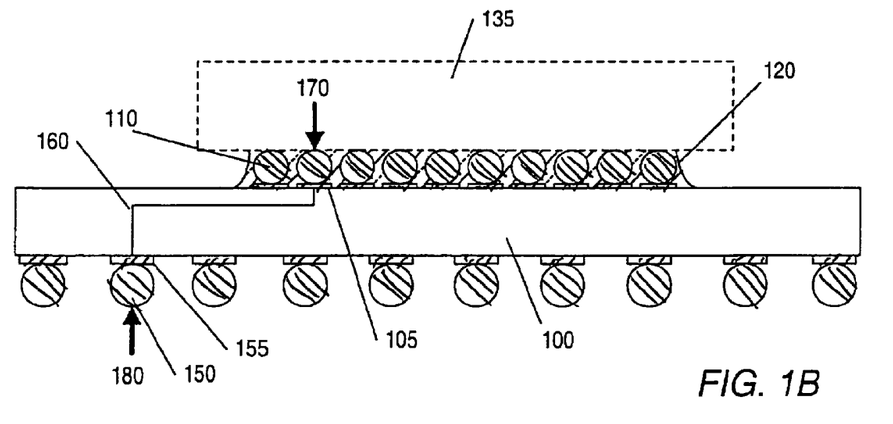
FIG. 1B is a cross-sectional view of the substrate after the removal of the overlying integrated circuit, and possibly a portion of the solder bump extending between the package and the integrated circuit.

FIG. 1B is a cross-sectional view of FIG. 1A, where the dotted box section 135 indicates the removal of integrated circuit chip 130 by a parallel lapping process, where the chip may be effectively removed by a polishing wheel grinder. The upper surface of solder bumps 110 (a portion of which may be removed by the grinder) is left exposed subsequent to the lapping procedure. Probe points 170 and 180 indicates the points of contact for external testing device to probe trace conductor 160 inside substrate 100. The terminals of trace conductor 160 are the contact point of a solder bump and the corresponding solder ball.

To determine whether the location of high resistance in trace conductor 160 resides inside the substrate or at one of its outside terminals, preferably a time-domain comparative analysis such as time-domain reflectometry (TDR) is employed. This TDR test is done prior to removal of chip 130 of FIG. 1A, where an incident electrical pulse is transmitted along the trace conductor. When the incident pulse encounters a discontinuity in the electrical conductivity, the pulse is reflected back. The time delay of the reflected pulse may be measured by a sampling oscilloscope and compared to other known delays, i.e, the measured TDR waveform is compared and matched to either a characteristic waveform for a known discontinuity defect within the substrate or the markedly different characteristic waveform for a known discontinuity defect outside the substrate proper. From this analysis one can determine if the discontinuity is in (i) the package substrate, (ii) the solder ball connection to the trace conductor/test terminal, (iii) the solder bump connection to the trace conductor/opposing test terminal, or (iv) the integrated circuit itself.

Figure 1C:
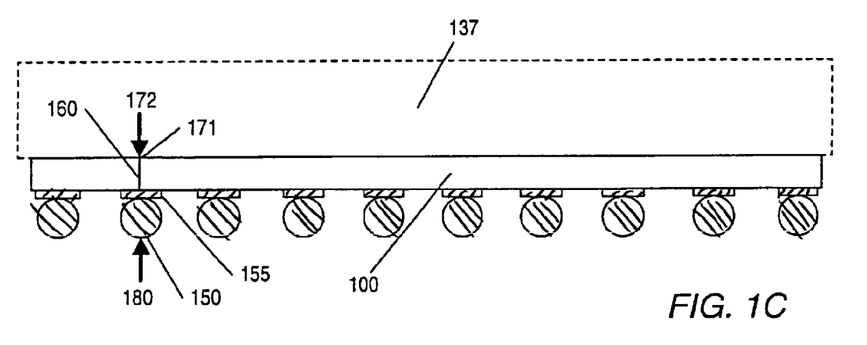
FIG. 1C is a cross-sectional view of the substrate after removal of one or more layers of the substrate.

FIG. 1C is a cross-sectional view of FIG. 1B , where substrate is shown in phantom to be partially removed. This is accomplished by removing one or more layers of the substrate by a polishing wheel grinder. Probe point 172 indicates the new probe point at upper terminus 171 of trace conductor 160. Probe point 172 is therefore different than probe point 170, for detecting possible open or short circuit conditions in the lower portion of the trace conductor since the upper portion had been removed. By comparing test results using probe point 170 with probe point 172, the defective portion of the trace conductor can be determined, i.e., the resistance between points 170 and 180 is far greater than between points 172 and 180, noting a possible open circuit of the trace conductor in an upper planar region that had been removed.

Figure 1D:
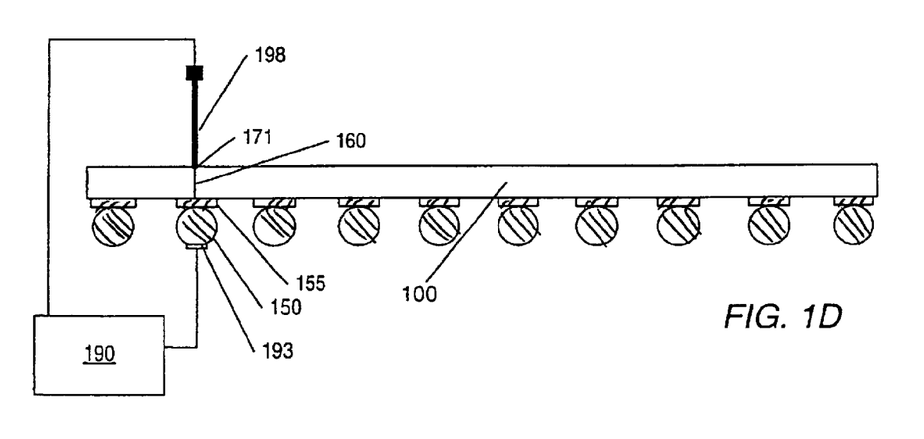
FIG. 1D is a cross-sectional view of an electrical probe testing of the substrate using a probe wire directly soldered onto a solder ball extending from the lower surface of the substrate.

FIG. 1D is a cross-sectional view of FIG. 1C, where a testing device 190 is electrically connected to trace conductor 160 at probe points 171 and 180. Testing device 190 may be a multi-meter for measuring the electrical continuity of trace conductor 160. One probe wire coming from device 190 is attached to solder ball 150 by, for example, solder joint 193. The other probe wire coming from device 190 has a probe needle 198 attached at its end and is typically manually placed into electrical contact with upper terminus 171. A magnifying lens of 2× or 5× may be employed to help locate and contact upper terminus 171 with probe needle 198. Unfortunately, during the lapping process, solder joint 193 may be jeopardized. Instead of connecting the probe needle by solder, it is desirable make frictional contact after the lapping process. Contact is contingent upon bring the opposing terminals in contact with the rather fine-line terminal ends of the trace conductor using a moveable substrate holder and moveable pin retainer to make contact as described in herein below.

Figure 2:
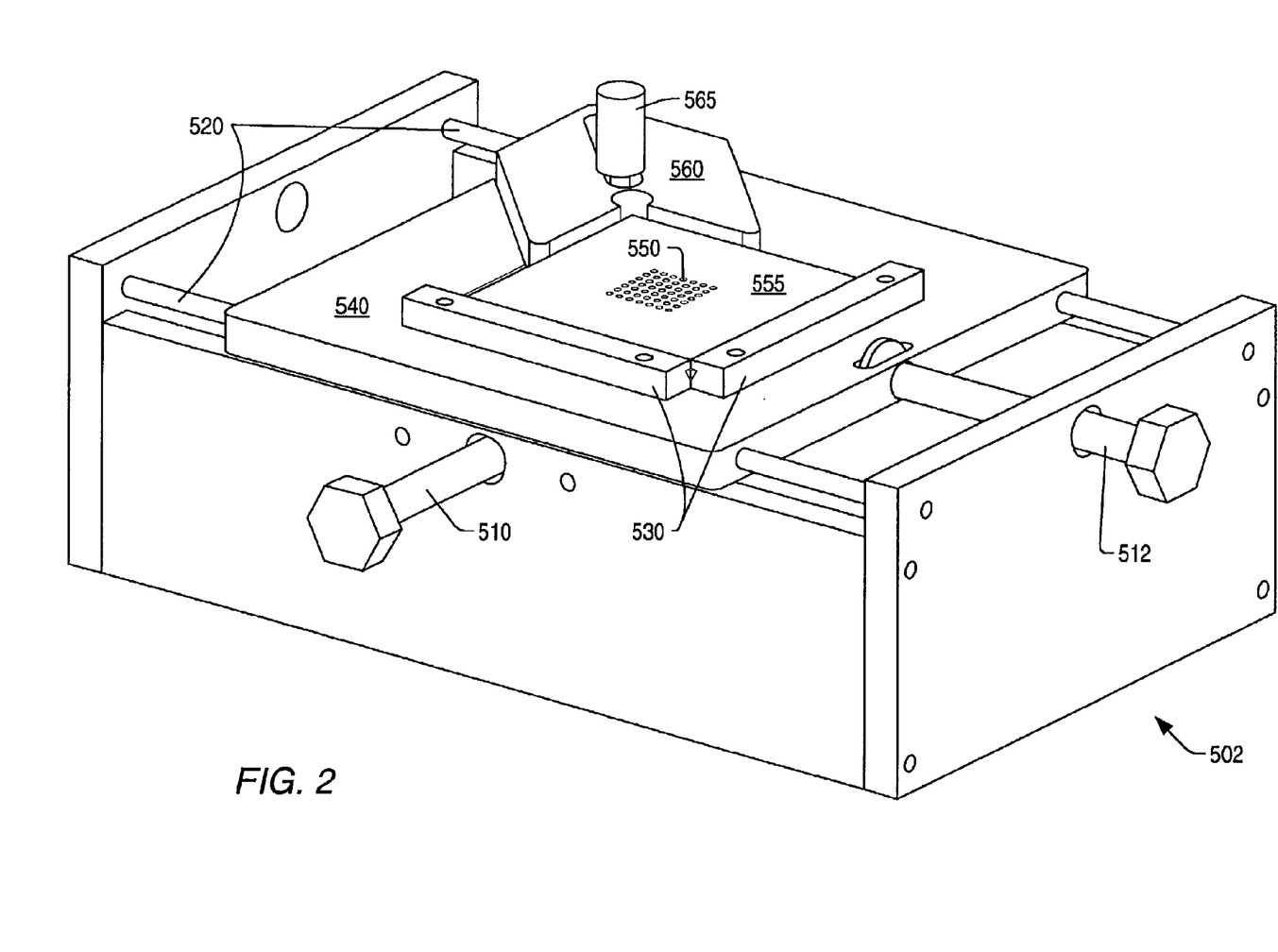
FIG. 2 is a top view of a probe fixture for holding the substrate.

FIG. 2 is top view of semiconductor device package substrate probe fixture 502. Substrate holding table 540 is adapted to retain substrate 555 by holding it in place against retainer walls 530 with a sliding pushing plate 560, which is secured into place with thumb screw 565. Table 540 is moveable in a horizontal direction on sliding rods 520 by lead screw 512. Lead screw 510 is attached to a moveable probe pin assembly (not visible in FIG. 2) underneath table 540. Solder bumps or underlying terminal ends of a lapped trace conductor 550 are shown exposed after the removal of the preexisting flip-chip application die from substrate 555.

Figure 3A:
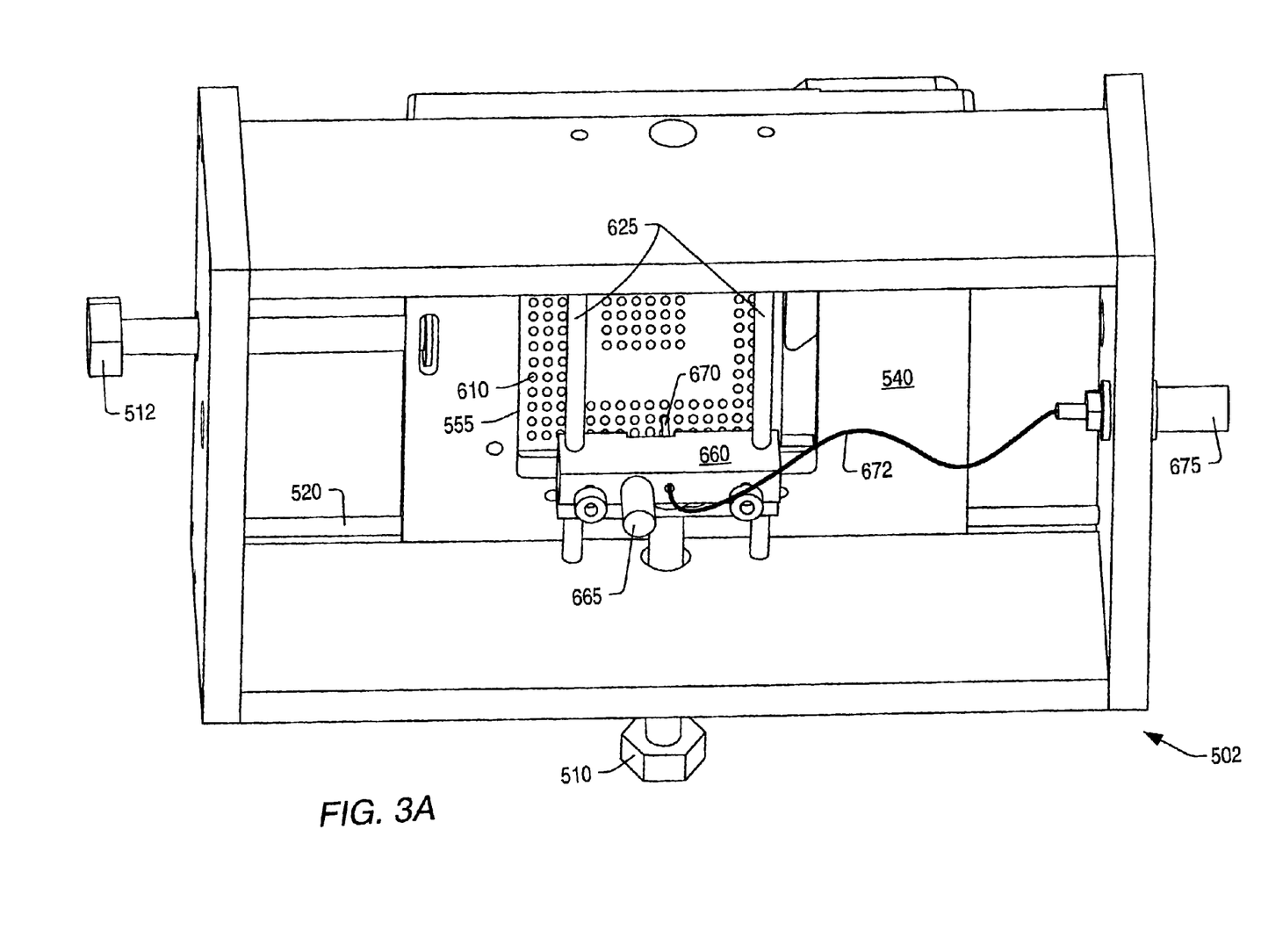
FIG. 3A is a bottom view of the probe fixture, and a collapsible pin extending upward from a mechanism that is moveable in the x- and y-planes.

FIG. 3A is a bottom view of semiconductor device package substrate probe fixture 502. Package holding table 540 has rectangular opening for exposing the bottom solder balls 610 of package substrate 555. Moveable table 540 is shown on sliding rods 520 and attached to lead screw 512. Probe pin 670 extends upward from a moveable pin retainer 660. Retainer assembly 660 can be moved in a vertical direction, perpendicular to the direction at which table 540 moves by adjusting lead screw 510 that is attached to assembly 660, which slides assembly 660 on slide rods 625. Thus probe pin 670 can be aligned in the horizontal and vertical (i.e., along both the x- and y-axis) with any solder ball 610 by adjusting lead screw 512 and/or lead screw 510. Probe pin 670 can be adjusted in the vertical axis to make strong mechanical and electrical contact with a solder ball 610, by vertical height adjusting thumbscrew 665. Probe pin 670 is preferably a pogo pin with an internal spring at the base, which helps provide a firm contact on solder ball 610, while preventing a destructive pressure from being applied to the solder ball 610. Furthermore, probe pin 670 is electrically coupled to electrical outlet socket 675 by electrical wire 672. By rotating thumb screw 512, pin 670 moves in an x-axis; by rotating thumb screw 510, pin 670 moves in a y-axis perpendicular to the x-axis, and by rotating thumb screw 665, pin 670 moves in a z-axis perpendicular to the x-axis and y-axis. Importantly, the distal end of pin 670 can be moved in fine-line increments in three axes relative to a solder ball on the underneath side of a substrate. Pin 670 frictionally engages with the solder ball, without employing a solder connection and the problems associated therewith.

Figure 3B:
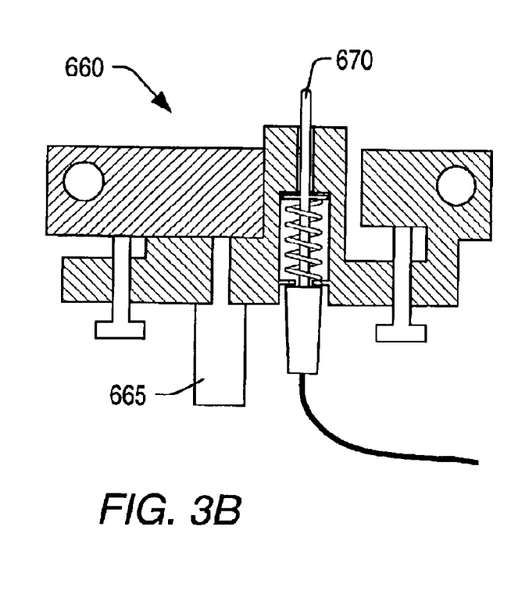
FIG. 3B is a cross-sectional view of the pin assembly of FIG. 3A.

FIG. 3B is an exploded view of probe pin assembly 660 of FIG. 3A. Probe pin 670 is shown to be pogo pin with an internal compressible spring, which provides secure frictional engagement with the solder ball onto which it is directed by the present fixture. The amount of engagement is determined by the strength of the biasing member, or spring, and the vertical height adjustment of pin 670. Vertical height adjusting thumbscrew 665 is shown. By rotating the thumbscrew, the housing within which pin 670 is placed moves up and down relative to assembly 660.

Figure 4:
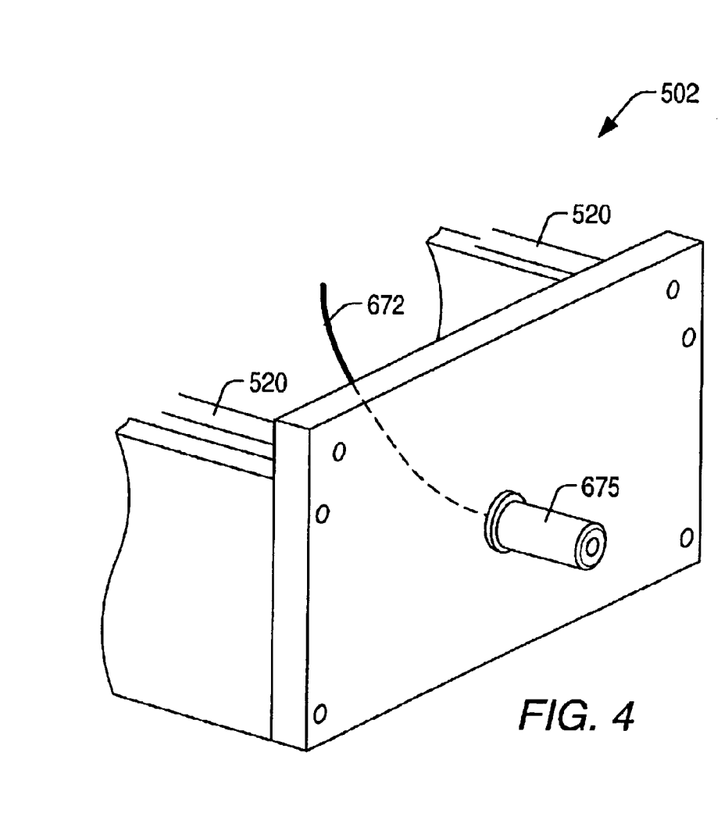
FIG. 4 is a side view of the probe fixture.

FIG. 4 is side view of semiconductor device package substrate probe fixture 502. Electrical outlet socket 675 is shown extending from the side surface. It could also be designed so that its outer edge is flush with the outer side surface of fixture 502. It is electrical attached to wire 672, which is coupled to assembly 660 of FIG. 3. Slide rods 520 are shown for the substrate holding table.

Figure 5:
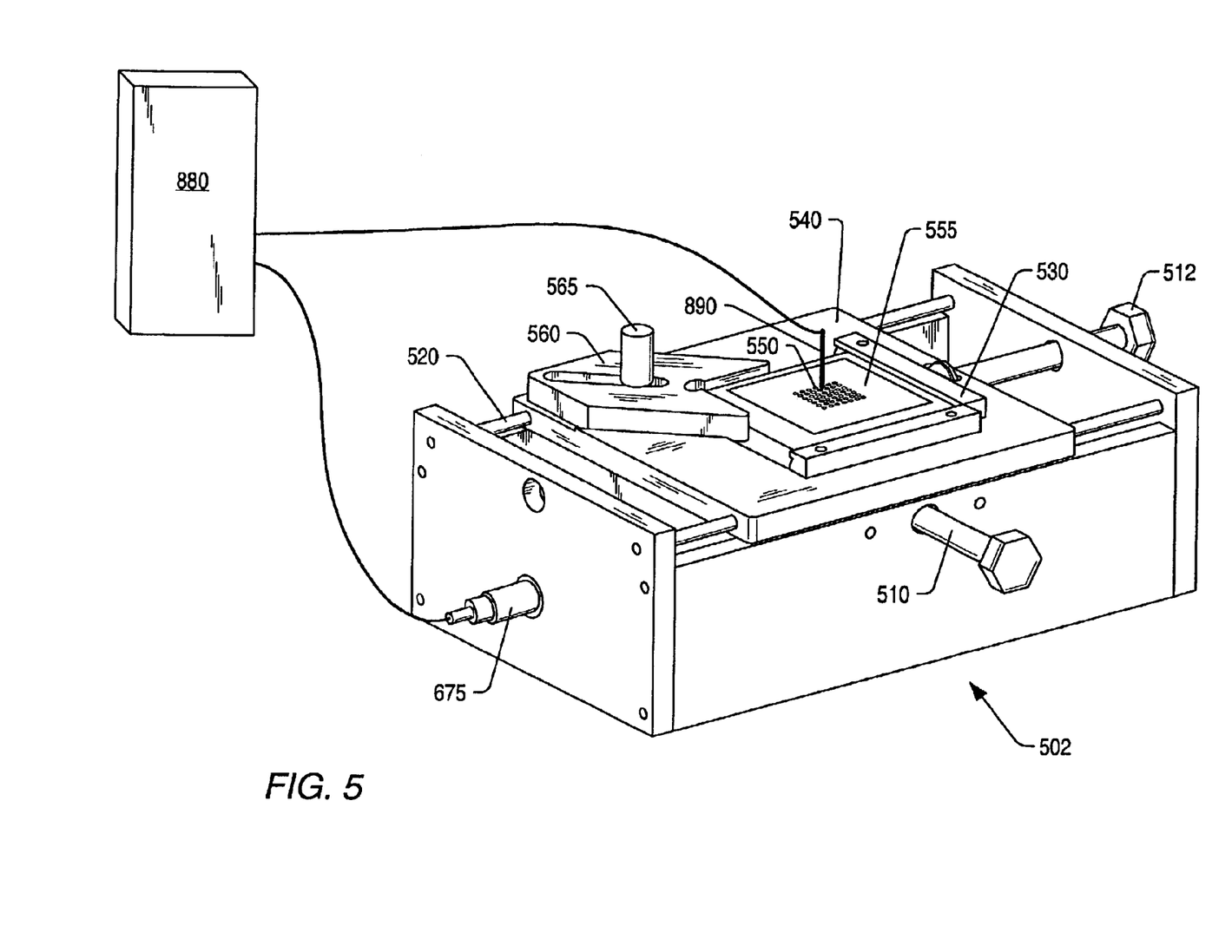
FIG. 5 is a top view of the probe fixture electrically connected to an electrical testing device.

FIG. 5 is top view of semiconductor device package substrate probe fixture 502 attached to electrical testing device 880. Testing device 880 is preferably a multi-meter for measuring electrical continuity of failed trace conductors inside package substrate 555. One probe wire coming from device 880 is coupled to electrical outlet socket 675, which is electrically attached to a probe pin underneath holding table 540, where the probe pin is contacting a solder ball terminal probe point of the trace conductor. The other probe wire coming from device 880 has a probe needle 890 attached at its end and is typically manually placed in electrical contact with an upper terminus or solder bump 550 of the trace conductor on the upper surface of substrate 555. A magnifying lens of 2× or 5× may be employed to help locate and contact said upper terminus with probe needle 890. Probe package holding table 540 is adapted to retain package substrate 555 by holding it into place against retainer walls 530 with a sliding push plate 560, which is secured into place with thumbscrew 565. Table 540 is designed failure analysis, usable for manual removal and attachment of the substrate on probe fixture 502. Substrate 555 may be a multi-layer substrate with as many as eight or more layers. To find the layer containing the defective portion of the trace conductor, the testing method may require the subsequent removal of one or more substrate layers. An outline of the testing procedure is to electrically test substrate 555 with device 880, and if the resistance measured is high then one removes substrate 555 from fixture 502. An upper layer of substrate 555 is removed by an external lapping device, and the above procedure is repeated until the defective layer is found. The layer may be removed by a polishing grinding wheel. Sliding rods 520 and lead screw 512 are used for moving table 540 in an x-direction as shown. Lead screw 510 is reciprocally coupled to a moveable probe pin assembly underneath table 540, is shown.

It will be appreciated to those skilled in the art having the benefit of this disclosure that this invention is believed to provide a semiconductor device package substrate probe fixture combining a moveable substrate retainer and a moveable pin retainer, where both the substrate and pin retainers are coupled to translational mechanisms that allow the probe pin to move in an x/y plane so that the probe pin can be aligned with a solder ball on the underneath side of the substrate. The probe pin provides electrical conductivity of a terminal of test device, and provides a method for such testing of trace conductors inside a package substrate. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A test fixture, comprising;
   a table moveable in a first direction, wherein the table is adapted to secure a substrate embodying a trace conductor having opposing ends terminating at respective opposing planar surfaces of the substrate;
   a probe pin moveable in two directions perpendicular to the first direction, wherein the probe pin is adapted to contact a first one of the opposing ends; and
   a probe needle adapted to contact a second one of the opposing ends.

2. The test fixture of claim 1, further comprising a test device for sending and receiving signals to the probe needle and the probe pin.

3. The test fixture of claim 1, wherein the probe pin moves along axes parallel to and perpendicular to a planar surface on which said first one of the opposing ends is arranged for contacting an upwardly extending distal end of the probe pin with a downwardly extending said first one of the opposing ends.

4. A test fixture, comprising:
   a pin retainer for retaining only one upwardly extending pin;
   a semiconductor substrate retainer having a trace conductor with one end of the trace conductor arranged above the pin; and
   a mechanism for moving the pin retainer and semiconductor substrate in two dimensions for aligning the probe pin onto said one end of the trace conductor.

5. The test fixture of claim 4, wherein an end opposite said one end of the trace conductor is adapted to receive a probe needle, and wherein a test device is coupled between the probe needle and the pin.

6. The test fixture of claim 5, wherein the test device forwards stimuli and receives response, during use, for testing integrity of the trace conductor.

7. The test fixture of claim 5, wherein the test device is a multi-meter for testing open circuit or short circuit conditions of the trace conductor.

8. The test fixture of claim 5, wherein the substrate retainer comprises:
   a table;
   a pair of elongated walls secured to the table and extending orthogonal to each other; and
   a push plate slideably attached to the table for securing the substrate onto the table between the push plate and the pair of elongated walls.

9. The test fixture of claim 8, wherein the push plate is secured in position upon the table by a thumbscrew secure pin.

10. The test fixture of claim 4, wherein the mechanism comprises:
    a first lead screw that, during rotational movement of the first lead screw, extends against the pin retainer; and
    a second lead screw that, during rotational movement of the second lead screw, extends against the semiconductor substrate retainer.

11. The test fixture of claim 10, wherein the mechanism comprises a third lead screw that, during rotational movement of the third lead screw, extends the pin upward in a dimension perpendicular to the two dimensions in which the pin retainer and semiconductor substrate retainer move.

12. A method for testing a semiconductor package, comprising:
    moving a substrate bearing a plurality of downwardly extending terminal ends of a trace conductor along an x-axis; and
    moving an upwardly extending pin along a y-axis and a z-axis to make contact with only one of the plurality of downwardly extending terminal ends.

13. The method of claim 12, wherein prior to said moving steps, further comprising:
    removing at least a portion of an integrated circuit bonded to an upper surface of the substrate; and
    holding the substrate on a moveable table for exposing a backside surface of the substrate bearing the downwardly extending terminal end to the upwardly extending pin.

14. The method of claim 13, wherein said removing comprises grinding the integrated circuit.

15. The method of claim 13, wherein said holding comprises retaining the outer periphery of the substrate above the table by securing opposed outer portions of the substrate between a moveable sliding push plate and elongated walls mounted to the table.

16. The method of claim 12, wherein after said moving steps, further comprising:
    contacting a probe needle to an upwardly extending terminal end of the trace conductor opposite the downwardly extending terminal end;
    applying electrical stimulus to the probe needle and the pin; and
    measuring a response.

17. The method of claim 12, further comprising:
    transmitting an electrical pulse along the trace conductor;
    measuring a time delay of an ensuing reflected pulse; and
    determining from the delay time a location of high resistance defect in the trace conductor as either residing inside or outside the substrate.

18. The method of claim 16, wherein said measuring comprises measuring electrical resistance of the trace conductor between the probe needle and the pin.

\* \* \* \* \*